United States Patent [19]
Mittal

[11] Patent Number: 5,301,318
[45] Date of Patent: Apr. 5, 1994

[54] HIERARCHICAL NETLIST EXTRACTION TOOL

[75] Inventor: Manmohan Mittal, Thousand Oaks, Calif.

[73] Assignee: Silicon Systems, Inc., Tustin, Calif.

[21] Appl. No.: 886,297

[22] Filed: May 21, 1992

Related U.S. Application Data

[62] Division of Ser. No. 194,430, May 13, 1988, abandoned.

[51] Int. Cl.⁵ ............................................. G06F 15/60
[52] U.S. Cl. ..................... 395/600; 364/283.1; 364/283.2; 364/489; 364/DIG. 1
[58] Field of Search .................. 395/500, 375, 600; 364/480, 488–491

[56] References Cited

U.S. PATENT DOCUMENTS

| | | | |
|---|---|---|---|
| 3,643,226 | 2/1972 | Loizedes et al. | 364/900 |
| 4,390,945 | 6/1983 | Olsen et al. | 364/200 |
| 4,507,752 | 3/1985 | McKenna et al. | 364/900 |
| 4,612,618 | 9/1986 | Pryor et al. | 364/488 |
| 4,769,817 | 9/1988 | Krohn et al. | 371/23 |
| 4,831,543 | 5/1989 | Mastellone | 364/489 |
| 4,882,690 | 11/1989 | Shinsha et al. | 364/490 |
| 5,111,413 | 5/1992 | Lazansky et al. | 364/578 |

OTHER PUBLICATIONS

L. G. Chen et al. "Hierarchial Functional Veri. for Cell-Based Design Styles" IEE Proc.-G. Circuit & System, v.1341 part G, No. 1, Feb. 1987, pp. 103-109.

Primary Examiner—Parshotam S. Lall
Assistant Examiner—Ayni Mohamed
Attorney, Agent, or Firm—Hecker & Harriman

[57] ABSTRACT

The present invention is directed to a method and apparatus for providing a general netlist extraction tool which generates tool-specific incremental and hierarchical netlist extractors. The present invention comprises three main functional modules; a netlist scheduler, a netlist extractor and a netlist binder. The netlist scheduler traverses the design tree to check for updated hierarchical blocks in the design by comparing the schematic sheet dates with the netlist file dates. Only updated blocks are scheduled for incremental netlisting. The netlist extractor expands and extracts the netlist of the updated blocks only. The netlist binder binds all the netlist files into a single complete netlist file using tool-specific hierarchical netlist input syntax. The netlist binder also integrates information about monitoring nodes, stimuli, models, external subcircuits and analysis statements from a user-provided, single tool control file. The present invention provides a hierarchical netlist file which preserves schematic hierarchy, making it easy to correlate simulation results with the schematics. The incremental mode of the present invention reduces total simulation and netlisting time. By doing incremental and hierarchical netlisting, run time memory, as well as disk space requirements, are reduced.

16 Claims, 5 Drawing Sheets

HIERARCHICAL NETLIST EXTRACTION TOOL

This is a continuation of application Ser. No. 194,430 filed May 13, 1988, now abandoned.

BACKGROUND OF THE PRESENT INVENTION

1. Field of the Invention

This invention relates to incremental and hierarchical netlisting.

2. Background

Integrated circuits are used in a large number of applications and products. In many cases, standard "off the shelf" integrated circuits are utilized as solutions for various applications. These standard integrated circuits are often utilized in high-volume applications. However, there are many low-volume or specialized applications for which it is economically unfeasible to use such standard circuits or for which the standard circuits do not provide the necessary functions required by the specific application. In these instances, specialized "custom" integrated circuits are designed and produced for the particular application. Such a custom circuit is known as an application specific integrated circuit (ASIC).

An ASIC designer utilizes a library of components from which to build custom circuits. A component is a device or circuit used as a building block and which can be joined with other components to provide desired functionality. The design of an ASIC is often done through the use of computer aided engineering (CAE) tools.

Often, commercial standardized CAE tools (simulators and automatic layout and test engineering systems) are purchased from different sources and integrated into a single work station environment. One disadvantage of such commercial CAE tools is that their data bases (used for netlisting) are "flat" (do not preserve schematic hierarchy and require large disk/memory space), slow (no incremental netlisting) and restrictive. If, for example, a designer makes a single change to the schematic, the netlist tools re-expand and renetlist the whole design completely, instead of only the change. This is because schematic hierarchy is not preserved during netlisting process.

Another disadvantage of prior CAE tools is difficulty in the development of front end integration for various tools (e.g., specific netlist extraction tools) which requires a major effort to integrate all CAE tools within a single schematic data base.

Another disadvantage of prior CAE tools in a work station environment is that all CAE tools have different front end "interface" and user interfaces.

However, most of the tools require, basically, connectivity information of the components and electrical/physical design details in the text formats of each tool.

To solve the problem in this invention, a "Generic Netlist Extraction Tool" was developed as a CASE (Computer-Aided Software Engineering) tool for automatically generating "C" language source code for various tool specific netlist extraction tools.

Therefore, it is desirable to provide a "general" netlist extraction tool for generating c-language source code for tool-specific incremental and hierarchical netlist extractors.

It is another object of the present invention to provide an extraction tool which maintains schematic hierarchy so that the simulation resulting can be coordinated with the actual schematic.

SUMMARY OF THE PRESENT INVENTION

The present invention is directed to a method and apparatus for providing a general netlist extraction tool which generates tool-specific incremental and hierarchical netlist extractors. The present invention comprises three main functional modules; a netlist scheduler, a netlist extractor and a netlist binder. The netlist scheduler traverses the design tree to check for updated hierarchical blocks in the design by comparing the schematic sheet dates with the netlist file dates. Only updated blocks are scheduled for incremental netlisting. The netlist extractor expands and extracts the netlist of the updated blocks only. The netlist binder binds the netlist files for all the incremental blocks into a single complete netlist file using tool-specific hierarchical netlist input syntax. The netlist binder also translates information about monitoring nodes, stimuli, models, external subcircuits and analysis statements from a unified user-provided, single tool control file in to tool-specific formats. Therefore, the present invention provides a hierarchical netlist file which preserves schematic hierarchy, making it easy to correlate simulation results with the schematics. The incremental mode of the present invention reduces total simulation and netlisting time. By doing incremental and hierarchical netlisting, run time memory, as well as disk space requirements, are reduced.

The present invention benefits the designer and CAE engineer with three major benefits over the existing system available:

(i) Reduces total simulation and netlist extraction time for a single change in the design.
(ii) Reduces run time and disk space requirements through incremental and hierarchical netlisting.
(iii) Provides a consistent inter-face for various simulation tools.

DETAILED DESCRIPTION OF THE PRESENT INVENTION

A hierarchical netlist extraction tool is described to be used for automatic generation of c-language code for tool specific simulation tools is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

In the production of ASIC design, a circuit designer lays out a circuit schematic on a work station using either top-down or bottom-up design hierarchy. The schematic is comprised of individual devices such as resistors, transistors, capacitors, switches, etc. and other hierarchical blocks. A database is then created of the schematic in which every device is listed, along with its properties, connectivity and proper dimensions to verify information (which device is connected to which other device). To verify the design, a designer needs to create a text file for different simulation and layout tools.

The listing of the schematic in the database is referred to as a "netlist". The netlist is comprised of a series of components. Each component includes information regarding the connectivity of the component and the properties of the component. A component may be a single device such as a resistor, capacitor, etc. A component which is a single device is referred to as a "primitive". In the hierarchy of various design tools, a primitive in one tool may be a block in another tool. For example, in circuit simulators a transistor is a primitive and a gate is a block. In logic simulation tools, a gate is a primitive.

A component may also consist of a sub-circuit of primitives referred to as a "Block". A Block is a group of components which are independent of other components. For example, an R/C oscillator circuit may be a Block in a design schematic. In this case, the Block (the oscillator) is comprised of a number of primitives, (resistor, capacitor, etc.).

A block may also be comprised of a combination of other Blocks or a combination of Blocks and primitives. For example, a Block may be a first order filter comprised of one or more switched capacitor Blocks and/or primitives.

The schematic may be thought of as a tree, where the lowest level of the tree is comprised of primitives and each upper layer is comprised of successive hierarchical levels of Blocks. The top component of the tree is a Block generally describing the entire circuit at a gross level (i.e. controller, processor, etc.). In the prior art, when a change is made to a component or primitive, the entire netlist must be regenerated. This is time consuming and slow. The present invention is directed to a method for hierarchical netlisting in which only those portions of the netlist requiring updating must be updated. An example of a prior art netlist for the example shift register design of Exhibit C is illustrated in Exhibit A attached hereto.

After the netlist is generated, the netlist is given to a simulating tool for verification of the design. Prior art simulating tools all require connectivity information and electrical and physical properties of components as input. However, the format (syntax) of the netlist input is different for different simulating tools. Therefore, different netlists must be generated for each type of simulating tool. The present invention provides a general netlist extraction tool for generating tool-specific incremental and hierarchical netlist extractors. The present invention includes method and apparatus for generating a tool specific netlist file which can be provided to a particular simulating tool.

The extraction tool of the present invention permits incremental netlisting by preserving schematic hierarchy. This provides a solution to the prior art problem of complete re-expansion and renetlisting a complete design each time a single change to the schematic data base is made.

The present invention consists of a functional level of a netlist scheduler, a netlist extractor and a netlist binder. The netlist scheduler compares the schematic sheet dates with the netlist file dates to check for updated hierarchical blocks in the design. Only these modified or added modules are renetlisted as macros and a complete hierarchical netlist file is generated using these macro netlist definitions. If the designs are hierarchical, the present invention provides much quicker simulation results after each change in the schematics.

A netlist extractor expands and extracts the netlist of the updated blocks only. This module spins "child processes" either on the same work station or on multiple work stations using a parallel distributed multi-processes algorithm.

Finally, the netlist binder binds all of the hierarchical block netlist files into a single complete netlist file using tool-specific hierarchical netlist input syntax. In this manner, a netlist may be generated for each type of CAE tool.

A hierarchical schematic design can be represented as a tree of hierarchical design components (e.g., flip-flops, counter, op amps, filters, etc.). Each component in the hierarchy corresponds to a node of the design tree. In any design, there are a few components which are more tightly coupled to their descendants than to other components. To take full advantage of netlist, it is assumed that for hierarchical netlisting of user-defined symbols, parameter passing properties and expressions for the blocks to be netlisted as macros are not used except the four parameters power supply names (NS, PS, WELL, in cross circuits and SUB) in CMOS circuits having more than one supply voltage circuits.

In the present invention, there are three types of components: primitive, flat, and block. As described previously, a primitive component is a component which cannot be broken down to a lower level for that particular tool. For example, a capacitor, resistor, or inductor are primitive components for circuit simulator, and logic gates are primitive for a logic simulator and are blocks for a circuit simulator. In particular, components which require special processing such as passing parameters down the tree and other dependencies must be processed "flat" (i.e., along with all of their children). These components are referred to as "flat components". In that case, designer is not taking full advantage of the incremental netlist process.

Other components can be processed independently of other components and can be used as macros/subcircuit calls. These components are referred to as "block components" and generally have no passing parameters. In some special cases, e.g. in CMOS, certain power supply parameters (PS, NS, WELL, and SUB) are allowed to be block component symbols even though they include passing parameters.

Each component will have a tool control property value to each tool. Other components may have any other tool-specific value including a flat value. The flat value is synonymous with a NONP value. If a tool control property is not present, that component will be assumed to be a flat type component. Block components have a tool control property value equal to "HBLOCK". These property values are used by the present invention to differentiate between a flat or block component during traverse of the design tree for a particular tool. This aids in the performance of incremental netlisting of the design.

Figure 1:
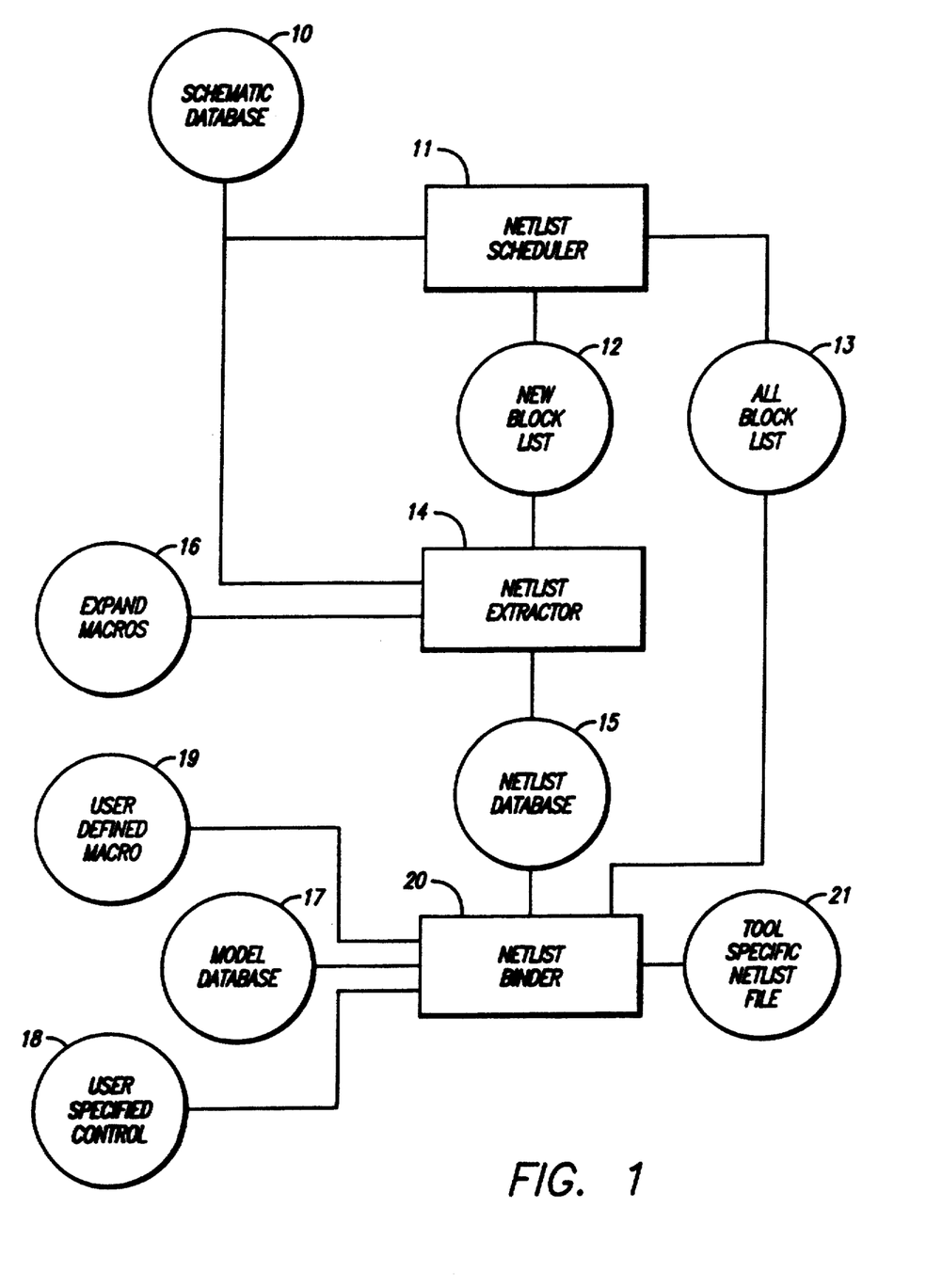
FIG. 1 is a block diagram illustrating an overview of the preferred embodiment of the present invention.

Referring now to FIG. 1, a block diagram illustrating an overview of the preferred embodiment of the present invention is illustrated. The hierarchical schematic data base (10) is a schematic design based on primitive, flat and block components created on a work station. The schematic data base 10 is provided to a netlist scheduler 11 and a netlist extractor 14.

The netlist scheduler traverses the schematic data base using top-down algorithm. During the process the netlist scheduler prepares a "New Block" list of updated files/added blocks for different CAE tools from block components of the schematic data base. Basically, the scheduler compares the dates of the schematic sheets with the netlist files of the block components. If the schematic sheet date is newer than the netlist date, the netlist at that block must be updated. The scheduler also prepares an "all-block" list of the design hierarchy for that tool.

Based on tool component property value, the netlist scheduler determines which components are treated as blocks and which are treated as flat, for netlisting purposes. In the preferred embodiment of the present invention, only symbol sheets are interpreted for the input components to speed up the decision-making.

The netlist scheduler outputs a new blocklist 12. The new blocklist 12 is a list of those components which have been updated or charged.

The new blocklist 12 is provided to the netlist extractor 14. The netlist extractor extracts netlist files for all of the block type of components, including top source 16 and can invoke the expand operation using tool-specific expand macros and user-defined parameter files. The netlist extractor also generates a global file under netlister directory which contains all of the global nets of the component which will be used by the netlist binder for generating global statements for complete design.

The netlist extractor extracts netlist files for all block components while translating and storing translated instance ID. This additional information is required for translation of hierarchical probes during processing of external control files. If a component is not a top component, then the netlist extractor creates a macro/subcircuit header using symbol sheet and also generates end of macro statement.

The netlist extractor picks one component at a time from the new block file. The netlist extractor first does an expansion of the component using expand macro and then extracts a flat netlist. The netlist extractor 14 outputs a netlist data base 15.

The netlist data base 15 is coupled to the netlist binder 20. The function of the netlist binder 20 is to assemble all the pieces of information required to generate a complete hierarchical tool input netlist file. The netlist binder 20 generally performs two operations. First, it assembles macro definitions for all the block components used in the design including netlist for top component.

Secondly, the netlist binder performs all the functions of the current external control file handler in hierarchical mode. The netlist binder first assembles macro definition netlist files of all block components in the design and then appends top component netlist files. It creates one complete netlist file under the netlister directory of the component. User-defined macros 19, user-specified control 18 and model data base 17 are coupled to the netlist binder 20. The netlist binder creates a tool-specific netlist file 21. The all-block list 13 generated by the netlist scheduler 11 is also inputted to the netlist binder 20.

THE NETLIST SCHEDULER

The purpose of the present invention is to speed up netlisting through incremental netlisting of individual components. This is done by marking some of the components in the hierarchy as being expanded and netlisted in the incremental mode. Incremental expansions are expansions of only those components which have changed since the last netlist. Accordingly, only those items need to be renetlisted.

Figures 2, 6A:
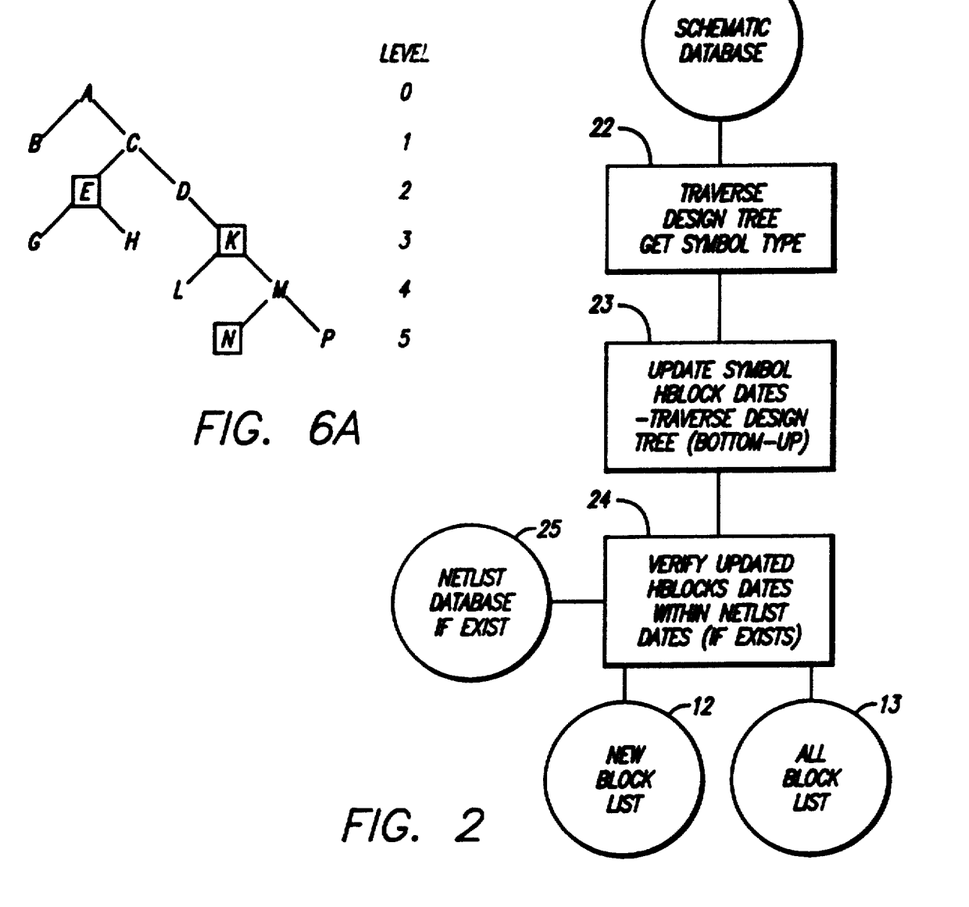
FIG. 2 is a flow-chart illustrating the netlist scheduler of the present invention.
FIGS. 6A and 6B illustrate the hierarchy and the sub-hierarchies of the netlist scheduler algorithm of the present invention.

The netlist scheduler is illustrated in detail in FIG. 2. As noted previously, the schematic database 10 is provided to the netlist scheduler 11. The netlist scheduler 11 performs the steps of blocks 22-25 of FIG. 2. Initially, the netlist scheduler traverses the design tree as shown at Block 22, from the top to the bottom, beginning at the top level component.

The netlist scheduler calls the symbol of the block component, its netlist date, and its level. The netlist scheduler then updates the symbol HBlock dates at Block 23 and traverses the design tree from the bottom to the top. The scheduler also propogates child component dates to the parents block date and stops the propogation of dates of those components which are block type.

At level 24, the netlist scheduler creates the New Block list 12 and All block list 13. The scheduler verifies updated HBlock dates within the netlist dates, if the netlist dates exist. The netlist database 25 is compared to the current list at Block 24. If the netlist database exists and it is older than the current list, the HBlock components are added to both the all Block list 13 and new Block list 12. Otherwise, the HBlock components are in the all Block list 13 only.

The new Block list 12 is an ASCII file. The new Block list is a list of all Block components which require re-netlisting. The new Block file is a list of updated or newly added Block components, located in the top component directory under the top component. It contains each block component's full path name.

The ALL BLOCK list 13 is also an ASCII file generated by the netlist scheduler. The all Block list is a list of all the Block component path names used in the design tree, regardless of when they were last changed in reverse hierarchical order. The order of listing is determined by finding the lowest level in the hierarchy that a component appears in and assigning a number to it. The top component is assigned level 0. Other components below that level are level 1, 2, 3, etc., based on their hierarchical level in the design.

Netlist Scheduler Algorithm

The netlist scheduler generates the two ASCII files according to the following algorithm:

1. Start at the top level component (treated as a block).
2. Call Sub-routine CHECKCOMP Check block components path name, netlist date and level.
3. CHECKCOMP description.
   a. Make a list of the current block components subcomponents (one level down).
   b. Loop through list of sub-components.
      i. Open each symbol database and read the value of the tool control property to establish if symbol is flat or block.

ii. If component is flat; compare its schematic file date against the parent block components net list. If the subcomponent has a later date than the netlist, set flag to update parent block. Make list of the sub-components of the current component. If any exist, recursively call CHECKCOMP.

iii. If current sub-component is Block; and if Block is currently stored in array, compare its level against the current level. If the current level is lower, update the level. If the Block is not currently stored in the array, save its path name, netlist date, and level in the hierarchy in an array. Go to next element in the loop (b).

4. At this point, one Block and all its flat sub-components and dates are checked. A partial list of block components has been generated. Loop through Blocks calling CHECKCOMP for each component.
5. Reverse sort list of all Blocks by level number and store in the all Block list file.
6. Look at update field in the Block array and write these items to the new Block list file in reverse hierarchal order.

The workings of this algorithm can be shown in the following example of FIG. 6, which illustrates a hierarchy with each letter representing a different component. Items in boxes are "Block" components. Other components are "Flat" components. The item being netlisted is treated like a Block for purposes of this netlist.

The "pathname" of a component is an ID for each Block at each Block level of hierarchy. The pathname contains the unique ID for that particular Block as well as the name of the file where information concerning that Block is stored. Such information includes component type, connectivity information, etc.

Still referring to FIG. 6A, the netlist scheduler begins at the lowest level (level zero) of the tree. The component at the top of the tree, in this case, component A, is treated as a Block. The scheduler then goes to the next level (Level 1) to check the sub-components of the current Block. In this case, both B and C are flat components and so become part of the sub-hierarchy of current Block A.

Moving to the next level, (Level 2) component E is a Block and component D is flat. Component D is a sub-component of component C, and so becomes part of the Block A sub-hierarchy. Component E is a Block which is the top of its own sub-hierarchy.

Proceeding to level 3, components G and H are flat components and are sub-components of Block E. Component K is a Block component and becomes the top component in its own sub-hierarchy.

At level 4, components L and M are both flat components and sub-components of Block K.

Finally, at the lowest level, level 5, component N is a Block component and begins its own sub-hierarchy. Component P is a flat component and is a sub-component of Block K.

Figure 6B:
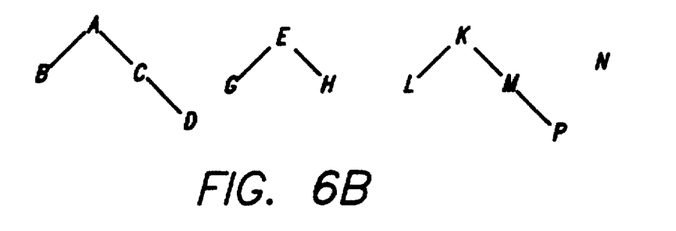

FIG. 6B shows the sub-hierarchies generated by the algorithm. Conceptually, the algorithm breaks up the hierarchy into sub-trees, each headed by a Block and having only Flat sub-components below it. After operation of the algorithm, the all Block list file is

N
K
E
A

The new Block list file is

K
A

NETLIST EXTRACTOR

Figure 3:
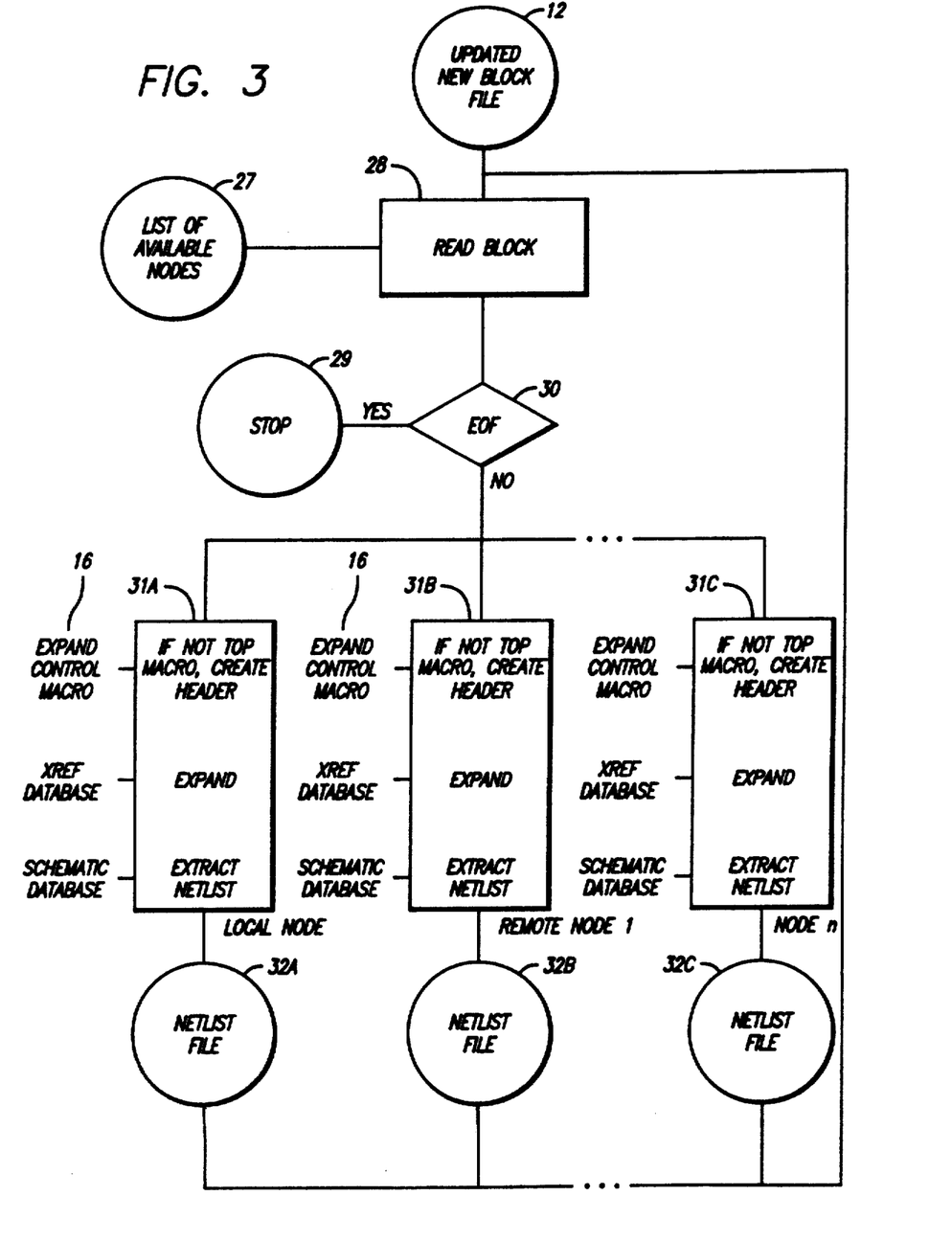
FIG. 3 is a flow-chart illustrating the netlist extractor of the present invention.

The netlist extractor is illustrated in detail in FIG. 3. The function of the netlist extractor is to extract netlist files for all the Block type of components (including the top components of the design).

The updated new Block file 12 provides a list of updated or newly added Block components to the netlist extractor. The netlist extractor checks the list of available nodes (Block 27) and reads the Block component (Block 28). The read Block 28 is coupled to the new Block file 12. The netlist extractor picks one component at a time from the new Block file 12. Initially, the netlist extract performs an end-of-file-check at decision Block 30 to determine if the entire new Block file 12 has been read. If yes, the netlist extractor stops (Block 29).

If the end-of-file has not been reached, the netlist extractor initially does a FLAT extraction of the component using the expand macro and then extracts a FLAT netlist. If the component is not a top component of the design, the netlist extractor creates a macro header using symbol sheet.

As noted, the input to the netlist extractor is the new Block list of the schematic database. The netlist extractor treats the top component like a Block type component, with the exception that no macro, header, or footer statements are generated for the top component.

The format of the file is one component path name per line. If the top component is to be netlisted, then it is explicitly marked as "top" after its path name. The top component is the last component in the file. The netlist extractor may include a switch "-NEX" for bypassing the netlist extract process completely. The switch can be used by users to bypass all the checking and netlisting.

Netlist Extractor Algorithm

The netlist extractor utilizes the following algorithm:
1. Initialization
   i. Check switch "-NEX". If enabled, exit netlist extractor.
   ii. Open new Block file in read mode.
2. Expand and extract.
   i. Read first component path name from the new block file.
   ii. When not (EOF) end of file for component path name in the new Block file two steps (iii) to (xi).
   iii. Check if the component path name exists. If so, continue. If not, give error message and go and read next component path name in the new Block file and repeat this step.
   iv. Initialize interfaces required to read particular schematic data base such as for example, the Mentor Design File Interface.
   v. Check if it is a top component and then go to (vii).
   vi. Create macro header for the component:
      a. Invoke symbol sheet of the component using an interface to read symbol sheets, e.g. Mentor sheetlister.
      b. Get all the pin names attached to the symbols. Process all the pins similar to net names (check for allowable length in the legal characters of all the pin names. If not okay, then substitute a legal character and translate long pin names to the unique pin names using net translation). Sort in alpha-numeric order and store in a macro pin name dynamic/link list in addition to cross reference database XREF.

c. Check to see if any of the four (PS, NS, SUB, WELL) properties are attached to the symbol and their property value is defined within parenthesis. If yes, then store those property values in the macro pin name table at the end of all pin names in alpha numeric order of power supply names only.

d. Generate macro name: Extract component's name from its path name and check for allowable length and any illegal characters. If it is not okay, then substitute illegal characters and translate long names to the unique short names. Check if this macro name is already present in the macro XREF file. If so, then append a unique number at the end of the name. After translation and checking, store generated macro name and complete component path name to the macro XREF file.

e. Write macro header statement using translated macro name and sorted pin and power supply names in a tool specific format in the HEADER file.

vii. Invoke expand using parameter file and control switch values in FLAT mode. Check for expand error. If error found, then give error message and go to the next component.

viii. Invoke FLAT tool specific netlister and extract netlist for the component. In addition to the general operations of a netlisting, the updated FLAT netlister will perform the following new operations:

a. During netlisting, if the component is not a top component, then search each net name in the macro pin name table. If the name is found, then set the found flag in the table. At the end of extraction, search for the pin names in the table not used in the netlist and generate a tool specific dummy component corresponding to each unused pin name in the macro pin name table.

b. While translating instance path names, get symbol path name for each BLOCK instance and store its symbol path name along with instance path name. This information is used by the netlist binder for resolving hierarchical instance/net path names. This is done inside XREF instance translation routine for the HBlock type instances.

c. While netlisting stores all the global nets in a global nets file under the components netlister directory ix. Save XREF database and close all files except new Block list.

x. Check save switch. If okay, then delete expand design file. If not, keep expand design file and go to next step.

xi. If the component is not a top component, then get the next component path name from the new Block list and go to step (ii). If the component is a top component, the netlist extractor is done.

xii. Close new Block list file.

xii. Check for errors. If errors exist, then abort netlister. Otherwise, the netlist extractor is done and control is passed to the netlist binder.

In a preferred embodiment of the present invention, the netlisting is part of a distributed environment. In other words, various work stations as a network operate on different Blocks of the schematic database. As shown in FIG. 3, the netlist extraction is done at each of the nodes 31A, 31B, and 31C for each work station. This generates local netlist files 32A, 32B and 32C. After the local netlists have been generated, they can later be combined into a single updated netlist.

Child Process

Figure 4:
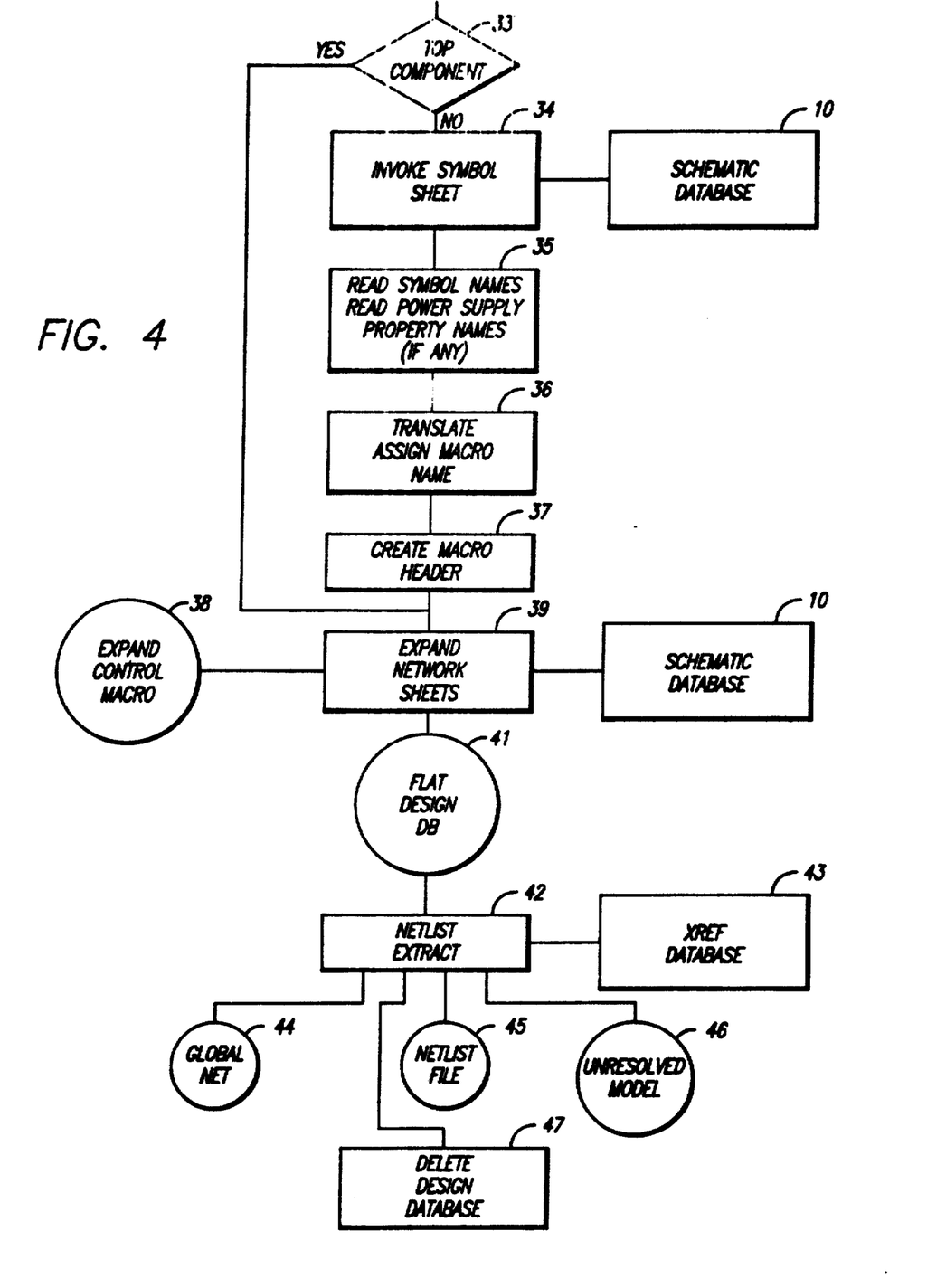
FIG. 4 is a flow-chart illustrating a child process of the netlist extractor of FIG. 3.

Referring to FIG. 4, a flow chart showing a child process is illustrated. The child process checks the new Block list and reads a component. The first test of the child process is to determine if the current component is a top component. A top component is a root of the design tree. Generally, the top component is any component at the lowest level currently being netlisted. If a component is not a top component it is an "intermediate" component.

If the current component is a top component, no macro header is created and the child process continues with Block 39. If the current component is not a top component, a symbol sheet is invoked at step 34. The database 10 contains a symbol sheet for each Block. The symbol of the Block contains pin information. Each pin name matches a port name on the schematic.

The next step of the child process at Block 35 is to read the symbol names and pin names, and also read the power supply property names. For example, a user may define his own power supply which may be different for different instances of the same circuit.

The next stop at Block 36 involves translating the component name and assigning a macro name to the component. At step 37, a macro header is created for the component. A macro header contains the Block symbol and its associated pin names. For each pin name, an associated netlist provides the components and/or Blocks connected to that pin.

Next, at step 39, the network sheets for the current Block are expanded (to update the netlist for the Block). The schematic database 10 is accessed and the netlist for the Block is updated. This generates a flat design database 41.

The flat design database 41 then undergoes a netlist extraction at step 42. It is often desired to pull out model information for the Block (e.g. primitive parameters, etc.), which generate unresolved model file 46. There may also be certain names which are defined as global and which are not passed through the pins. These names are kept in the global net file 44. Then of course, the netlist file 45 is created as well. This child process is done for each Block to generate incremental netlists.

NETLIST BINDER

Figure 5:
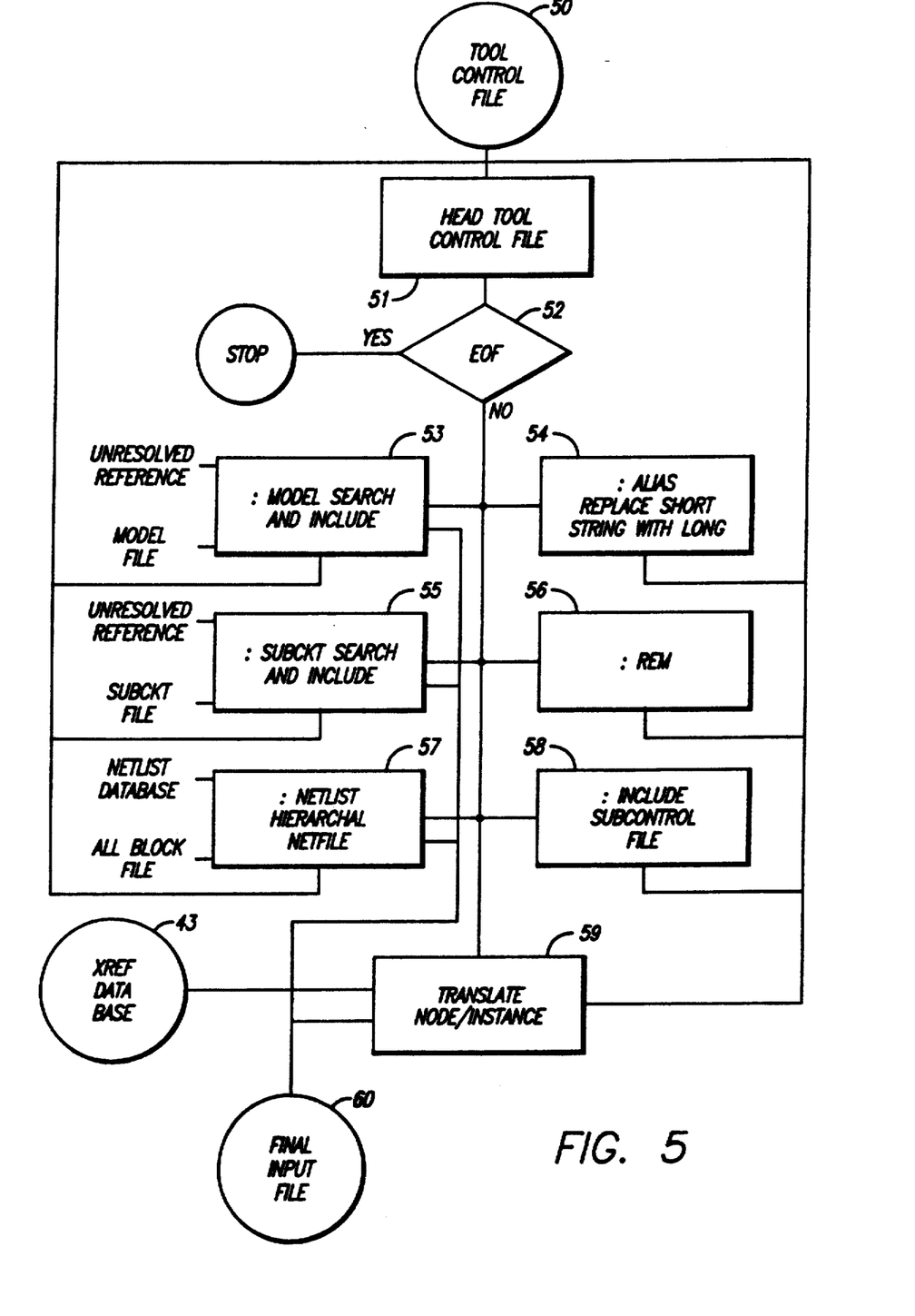
FIG. 5 is a flow-chart illustrating the netlist binder of the preferred embodiment of the present invention.

The function of the netlist binder, illustrated in FIG. 5, is to assemble all the pieces of information required to generate a complete hierarchical tool input netlist file. The binder performs two operations. First, it reassembles macro definitions for all the block type components used in the design, including netlist for top component. In hierarchical control file handling, instances and nets are referenced using tool specific hierarchical path names by the user in the tool control file instead of FLAT path names. At the end of complete assembly of the netlist file, a hierarchical control file handler generates a global statement considering all global net files of all the Block components, including the top component.

The netlist binder first assembles macro definition netlist files of all Block components in the design, and then appends the top component netlist file. It creates one completes netlist file under the netlister directory of the component. This file is used by the netlist command of the control file handler.

To assemble the complete netlist file, the netlist binder uses an ASCII input file generated by the netlist scheduler or the netlist extractor. The netlist scheduler generates a file containing a list of all the Block components under netlister directory of the component. A netlist extractor generated file is used for all the Block type components including top components under their corresponding netlister directories.

Netlist Binder Algorithm

The following is the algorithm utilized by the netlist binder:

STEP 1: GENERATE COMPLETE NETLIST FILE i. Check if NEW_BLOCK.LST file is empty then go to step (2) else continue.
ii. Using ALL_BLOCK.LST file assemble and generate the COMPLETE_NETLIST file as follows:
  a. Open COMPLETE_NETLIST file in append mode.
  b. Read first component pathname from ALL_BLOCK.LST file. Check if this component exist then continue else give error message and go to next component pathname in the file. Repeat this step until no error.
  c. WHILE not EOF for component pathnames DO step (d) to (j), i.e., (write following into COMPLETE_NETLIST file).
  d. Write the complete component pathname as comment line.
  e. If not TOP component then append contents of the HEADER file of the component into the complete netlist file.
  f. Open NETLIST file and append its content into the complete netlist file.
  g. If not TOP component then append an end-of-macro statement.
  h. Read global net names from GLOBAL_NETS file and insert all the net names if they are not into run time global-net-table.
  i. Read next component pathname from ALL_BLOCK.LST file. Check if exist then go to step (c) else give error message and go to next component pathname in the file.
  j. End of WHILE loop.
iii. After inserting component netlist, write a .GLOBAL statement using the run time global-net-table in COMPLETE_NETLIST file.
iv. CLOSE all the open files including COMPLETE_NETLIST file.

STEP 2: PROCESS EXTERNAL CONTROL FILE AND GENERATE THE COMPLETE TOOL INPUT NETLIST FILE i. Check the date of tool input netlist file with the dates of complete netlist file and tool control file. If tool input netlist file is current then netlisting is done else continue.
ii. Open tool control file and read each line as file and process based on keyword (; model, ; etc) (FIG. 5)
iii. Read top component XREF database into top-XREF-table.
iv. In :NETLIST command, use default netlist file name COMPLETE_NETLIST file under top component's netlister directory.
v. Process :SUBCKT, :MODEL, :INCLUDE, :TABLE, :REM in similar way as doing in flat EFH.
vi. Resolution of hierarchical instance or net pathname references (used in tool control/output command lines and/or in external circuitry device cards) shall be done as follows:
  a. Read complete hierarchical instance/net pathnames between { } or [ ] parentheses and parse them into different level of hierarchy fields. Put these fields into a field array using level of hierarchy as index number. Left most field of the hierarchical pathname is the top level in hierarchy which corresponds to the top component in the design. The hierarchy level of other fields in the pathname increases from left to right of the hierarchical pathname.
  b. Pass field array to XREF instance/net translation routine.
  c. After translation of fields in the field-array, assemble back hierarchical instance and net pathnames using translated fields.
vii. CLOSE all net pathnames using translated fields.

The operation of the netlist binder is illustrated in the flow chart of FIG. 5. After each Block has been netlisted, a master netlist is generated. This netlist is for use with a simulation tool so it must be put in the format for the simulation tool being utilized. At step 50, a used defined tool control file is provided defining the parameters and sequences of the simulation tool. This is specific to the type of simulation tool being utilized. This file contains the simulation tool commands. At step 52, a test is made to see if the end of file has been reached. If not, the netlist binder proceeds. At step 53, models of the primitives of the design are accessed and combined with the netlist database at step 57 to generate a final input file 60. The netlist binder takes the all Block list 13 (see FIG. 1) and combines it with the tool control file to create final input file 60 for the selected simulation tool.

Still referring to FIG. 5, various user-defined parameters can be implemented as shown at blocks 53-58. Referring first to block 53, ":Model" is a user-defined model data base stored in model data base storage 17 of FIG. 1. ":Subckt" at block 55 is a user-defined file to provide external sub-circuit definitions stored in the user-defined macro storage 19 of FIG. 1.

":Alias" is a control file limited user-defined command replacing long strings of characters with a single name. The :Alias command is specific to a particular file. At block 56, ":Rem" is a list of user-defined remarks that a user can include in a simulation or analysis as benchmarks or explanatory notes.

At block 58, ":Include" is utilized for a user to include any user-defined file which the user may provide, for example sub-control file for analysis statement, input-output voltage, etc. For example, a single circuit may have different voltage levels within the schematic. In other instances, the user may desire to implement different voltage levels for the same circuit in different tests.

At block 57, ":Netlist" access is the netlist data base-/or all block file so that the netlist may be combined with the user-defined parameters.

Referring to Exhibit B, a hierarchical netlist for the same data base generated using the present invention is illustrated. The hierchical netlist is shorter than the flat netlist of Exhibit A.

Thus, a netlist extraction tool which provides incremental and hierarchical netlisting has been described.

We claim:

1. A computer implemented method for providing a netlist extraction tool, comprising a netlist scheduler, netlist extractor, and netlist binder for generating an updated netlist of a first netlist having an associated date of creation of a data base comprised of a plurality of blocks in a hierarchical relationship having a plurality of levels, said method comprising the computer implemented steps of:

at a first level, comparing using said netlist scheduler, said first netlist to said data base to determine when changes have been made to said data base;

repeating the previous step, using said netlist scheduler, for successive levels of said data base until the lowest level at which a change occurs is determined;

generating a block list of said blocks that have been updated;

generating, in response to said block list, using said netlist extractor a sub netlist for said each updated block with said first netlist;

generating an incremental updated netlist by combining, using said netlist binder, said sub netlist for said each updated block with said first netlist;

whereby an incremental updated netlist is provided without reenlisting the entire data base.

2. The method of claim 1 wherein each of said blocks comprise at least one component.

3. The method of claim 2 wherein said component comprises a primitive.

4. The method of claim 2 wherein said component comprises a block at a lower level than said each block.

5. The method of claim 1 wherein each of said components has a date of revision and said date of creation is compared to said date of revision to determine if a change has been made to said data base.

6. A computer system for providing a netlist extraction tool that generates an incremental updated netlist of a first netlist having an associated date of creation of a data base comprised of a plurality of blocks in a hierarchical relationship having a plurality of levels comprising:

a netlist scheduler coupled to said data base, said netlist scheduler for determining when changes have been made to said data base repeating the determining step for successive levels of said data base until the lowest level at which a change occurred is determined and generating a block list of said block that have been updated;

a netlist extractor coupled to said netlist scheduler and said data base for receiving said updated block list and expanding and extracting the netlist of said updated blocks generating a subnetlist for said each updated block;

a netlist binder coupled to said netlist extractor for combining said subnetlist for said each updated block with said first netlist for forming an incremental updated netlist.

7. The system of claim 6 wherein said netlist scheduler determines when changes have been made to said data base for successive levels of said data base until the lowest level at which a change occurs is determined.

8. The system of claim 7 wherein each of said blocks comprise at least one component.

9. The system of claim 8 wherein said component comprises a primitive.

10. The system of claim 9 wherein said component comprises a block at a lower level at said each block.

11. The system of claim 10 wherein each of said components has a date of revision and said date of creation is compared to said date of revision to determine if a change has made to said data base.

12. A computer system for providing a netlist extraction tool that generates an incremental updated netlist of a first netlist having an associated date of creation of a data base comprised of a plurality of blocks in a hierarchical relationship having a plurality of levels comprising:

a netlist scheduler coupled to said data base, said netlist scheduler for determining when changes have been made to said data base, said netlist scheduler determining when changes have been made to said data base for successive levels of said data base until the lowest level at which a change occurs is determined, and said netlist scheduler generating a block list of said blocks that have been updated;

a netlist extractor coupled to said netlist scheduler and said data base for receiving said updated block list and expanding and extracting the netlist of said updated blocks generating a subnetlist for said each updated block;

a netlist binder coupled to said netlist extractor for combining said subnetlist for said each updated block with said first netlist for forming an incremental updated netlist.

13. The system of claim 12 wherein each of said blocks comprise at least one component.

14. The system of claim 13 wherein said component comprises a primitive.

15. The system of claim 14 wherein said component comprises a block at a lower level at said each block.

16. The system of claim 15 wherein each of said components has a date of revision and said date of creation is compared to said date of revision to determine if a change has made to said data base.

* * * * *

UNITED STATES PATENT AND TRADEMARK OFFICE
CERTIFICATE OF CORRECTION

PATENT NO. : 5,301,318
DATED : APRIL 5, 1994
INVENTOR(S): Manmohan Mittal, Thousand Oaks, Calif.

It is certified that error appears in the above-identified patent and that said Letters Patent is hereby corrected as shown below:

On the title page, ITEM:

--[75] INVENTOR(S): Louis Testa, Grass Valley, California; Greg Winner, Irvine, California Signed and Sealed this Sixteenth Day of May, 1995

Attest:

BRUCE LEHMAN

Attesting Officer     Commissioner of Patents and Trademarks